(12) United States Patent
Hao

(10) Patent No.: US 11,162,994 B2
(45) Date of Patent: Nov. 2, 2021

(54) FAULT CURRENT CALCULATION DURING TRANSFORMER SATURATION USING THE WAVEFORM UNSATURATED REGION

(71) Applicant: Schweitzer Engineering Laboratories, Inc., Pullman, WA (US)

(72) Inventor: Kei Hao, Anaheim, CA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 76 days.

(21) Appl. No.: 16/750,791

(22) Filed: Jan. 23, 2020

(65) Prior Publication Data
US 2021/0231723 A1     Jul. 29, 2021

(51) Int. Cl.
| | |
|---|---|
| G01R 31/08 | (2020.01) |
| G01R 19/25 | (2006.01) |
| H02H 1/00 | (2006.01) |
| H02H 1/04 | (2006.01) |

(52) U.S. Cl.
CPC ....... *G01R 31/085* (2013.01); *G01R 19/2513* (2013.01); *G01R 31/088* (2013.01); *H02H 1/0092* (2013.01); *H02H 1/046* (2013.01)

(58) Field of Classification Search
CPC ............... G01R 31/085; G01R 31/088; G01R 19/2513; H02H 1/046; H02H 1/0092
USPC ............................................. 324/126, 76.11
See application file for complete search history.

(56) References Cited

U.S. PATENT DOCUMENTS

| | | | |
|---|---|---|---|
| 5,974,361 A | 10/1999 | Vu | |
| 6,040,689 A | 3/2000 | Gluszek | |
| 9,250,282 B2 | 2/2016 | Ukil et al. | |
| 9,366,715 B2 | 6/2016 | Ukil et al. | |
| 10,585,133 B2 * | 3/2020 | Guzman-Casillas | G01R 31/085 |
| 10,637,233 B2 | 4/2020 | Hao | |
| 10,978,866 B2 * | 4/2021 | Kasztenny | H02H 1/003 |
| 10,989,752 B2 * | 4/2021 | Schweitzer, III | H02H 7/265 |
| 2005/0094344 A1 | 5/2005 | Kang | |
| 2013/0141827 A1 | 6/2013 | Ukil et al. | |
| 2013/0221977 A1 | 8/2013 | Ukil et al. | |
| 2015/0309105 A1 * | 10/2015 | Ostrovsky | G01R 35/00 324/509 |

(Continued)

FOREIGN PATENT DOCUMENTS

| | | |
|---|---|---|
| CA | 2929382 | 5/2014 |
| CN | 106099850 | 11/2016 |

(Continued)

OTHER PUBLICATIONS

Ukil, Abhisek, et al., "Current-Only Directional Overcurrent Relay". IEEE Sensors Journal, Nov. 22, 2010, vol. 11, Issue 6.

(Continued)

*Primary Examiner* — Giovanni Astacio-Oquendo
(74) *Attorney, Agent, or Firm* — Richard M. Edge

(57) ABSTRACT

Line-mounted devices for determining fault magnitude in an electric power delivery system even under current-transformer (CT) saturation are disclosed herein. Fault magnitude is calculated using unsaturated regions of a current waveform captured by the line-mounted device. The method of determining the unsaturated regions is computationally efficient. Fictitious peaks are removed, and the unsaturated regions are determined based on fractions of the valid peaks. Fault current magnitude is calculated using sample values in the unsaturated regions.

20 Claims, 11 Drawing Sheets

(56) References Cited

U.S. PATENT DOCUMENTS

| | | | |
|---|---|---|---|
| 2016/0097804 A1* | 4/2016 | Chang | G01R 31/2839 |
| | | | 324/750.01 |
| 2016/0109482 A1* | 4/2016 | Richmond, II | G01R 31/2879 |
| | | | 324/754.07 |
| 2020/0319240 A1 | 10/2020 | Hao | |

FOREIGN PATENT DOCUMENTS

| | | |
|---|---|---|
| EP | 506035 | 11/1996 |
| WO | 2009118048 | 10/2009 |

OTHER PUBLICATIONS

Ukil, Abhisek, et al., "Current-Only Directional Overcurrent Protection for Distribution Automation: Challenges and Solutions". IEEE Transactions on Smart Grid, Aug. 22, 2012, vol. 3, Issue 4.
Chothani et. al., "New Algorithm for Current Transformer Saturation Detection and Compensation Based on Derivatives of Secondary Currents and Newton's Backward Difference Formulae" IET Gener. Transm. Distrib., 2014, vol. 8, Iss. 5, pp. 841-850. 2014.

* cited by examiner

US 11,162,994 B2

FAULT CURRENT CALCULATION DURING TRANSFORMER SATURATION USING THE WAVEFORM UNSATURATED REGION

RELATED APPLICATION none

TECHNICAL FIELD

This disclosure relates to calculating a fault current on an electric power delivery system. More particularly, this disclosure relates to calculating the fault current during current transformer saturation using the unsaturated region of the current waveform. This disclosure uses a computationally efficient method to calculate the unsaturated region.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
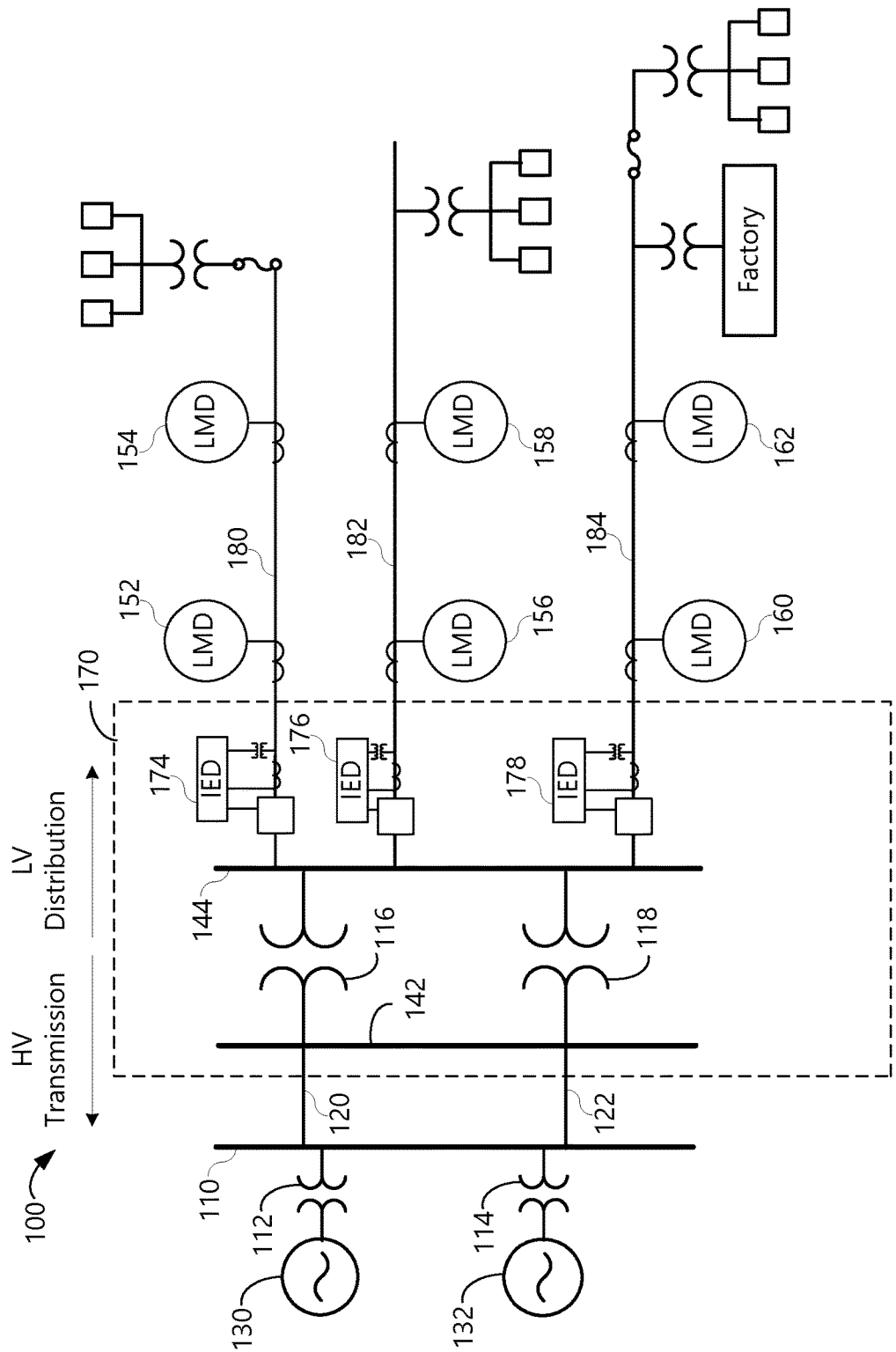
FIG. 1 illustrates a simplified one-line diagram of an electric power delivery system

Electric power delivery systems are used throughout the world to generate, transmit, and distribute electric power to loads for consumption. To monitor, protect, and automate the electric power delivery system and its equipment, intelligent electronic devices (IEDs) may be used to obtain and process information from the electric power delivery system, perform monitoring and protection functions, and effect control operations on the electric power delivery system equipment. Typically, IEDs are located at substations and near major equipment.

To improve the data gathering, monitoring, and protection of the electric power delivery system, line-mounted devices may be used to obtain electric power system measurements and provide measurements and information to IEDs and supervisory systems. Measurements and electric power delivery system information from line-mounted devices may be used by IEDs to improve monitoring and protection of the electric power delivery system. For example, a line-mounted device may obtain current measurements during a fault condition. The line-mounted device may detect the fault, and report the fault condition along with a fault magnitude to the IEDs or supervisory system. IEDs or the supervisory system may use fault magnitude to determine a more accurate fault location. Indeed, an IED may provide a better estimation of the fault location using a fault magnitude from a line-mounted device nearer to the fault than a fault magnitude obtained from the location of the IED.

Accordingly, what is needed is a line-mounted device that provides an accurate fault magnitude calculation to an IED to improve the accuracy of the fault location calculation as well as other protection, monitoring, and control operations of the IED. Furthermore, what is needed is a line-mounted device that provides accurate fault magnitude calculation during current transformer (CT) saturation. Also, what is needed is a line-mounted device that provides accurate fault magnitude calculation while reducing power consumed by the line-mounted device.

Line-mounted devices may obtain electric power current measurements from the line using CTs. CTs used be line-mounted devices may be constrained by requirements related to size, power consumption, weight, and the like. Accordingly, CTs used by line-mounted devices may saturate when the current exceeds the nominal current for the portion of the electric power delivery system where the line-mounted device is applied or when current approaches a fault current magnitude.

Accordingly, what is needed is a method to determine a current signal using the output of a saturated CT. Electric power system monitoring and protection is improved by the calculation of current signals using the output of a saturated CT. Furthermore, the accuracy of a fault location is improved by using a fault magnitude from a line-mounted device even under saturated CT conditions.

Prior methods to compensate for CT saturation have been computationally expensive. Line-mounted devices are limited in power options. They may derive operational electric power parasitically from the monitored conductor and/or include power storage in the form of a battery, capacitor, or similar device. Such power options offer a limited amount of electric power especially under fault conditions. Accordingly, to reduce the power burden during fault conditions, what is needed are methods and devices for computationally efficient current calculation even during CT saturation.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. In certain embodiments, a particular software module or component may comprise disparate instructions stored in different locations of a memory device, which together implement the described functionality of the module. Embodiments may be provided as a computer program product including a non-transitory computer and/or machine-readable medium having stored thereon instructions that may be used to program a computer (or other electronic device) to perform processes described herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a simplified one-line diagram of an electric power delivery system 100. Electric power may be generated by generation sites 130, 132, which supply electric power to a transmission bus 110 via transformers 112, 114. Electric power may be transmitted via transmission lines 120, 122 to bus 142 at substation 170. Transformers 116, 118 may reduce voltage of the electric power from bus 142 to distribution bus 144. Several feeders 180, 182, 184 may distribute electric power from distribution bus 144 to various loads.

Although not separately illustrated, various of the electric power delivery system equipment may be monitored or protected by various IEDs. For example, generators may be monitored and protected by generator IEDs. Transformers, buses, transmission lines, and the like may be monitored and protected by respective IEDs. Feeder 180 may be monitored and protected using IED 174, which obtains electric power signals from feeder 180 using CTs, PTs, and the like; and may effect control of the electric power system by control of a circuit breaker. Similarly, feeder 182 may be monitored and protected using IED 176, and feeder 184 may be monitored and protected using IED 178.

To improve the monitoring and protection of feeders 180, 182, and 184, line-mounted devices (LMDs) 152, 154, 156, 158, 160, and 162 may be used on feeders 180, 182, and 184. LMDs may obtain electric power signals from feeders 180, 182, 184 using, for example, CTs. Upon obtaining electric power signals, LMDs may sample a secondary signal from CTs, determine a fault condition, determine a fault current magnitude, and transmit information such as current, fault current magnitude, and the like to IEDs 174, 176, and 178 according to the embodiments herein described.

Figure 2A:
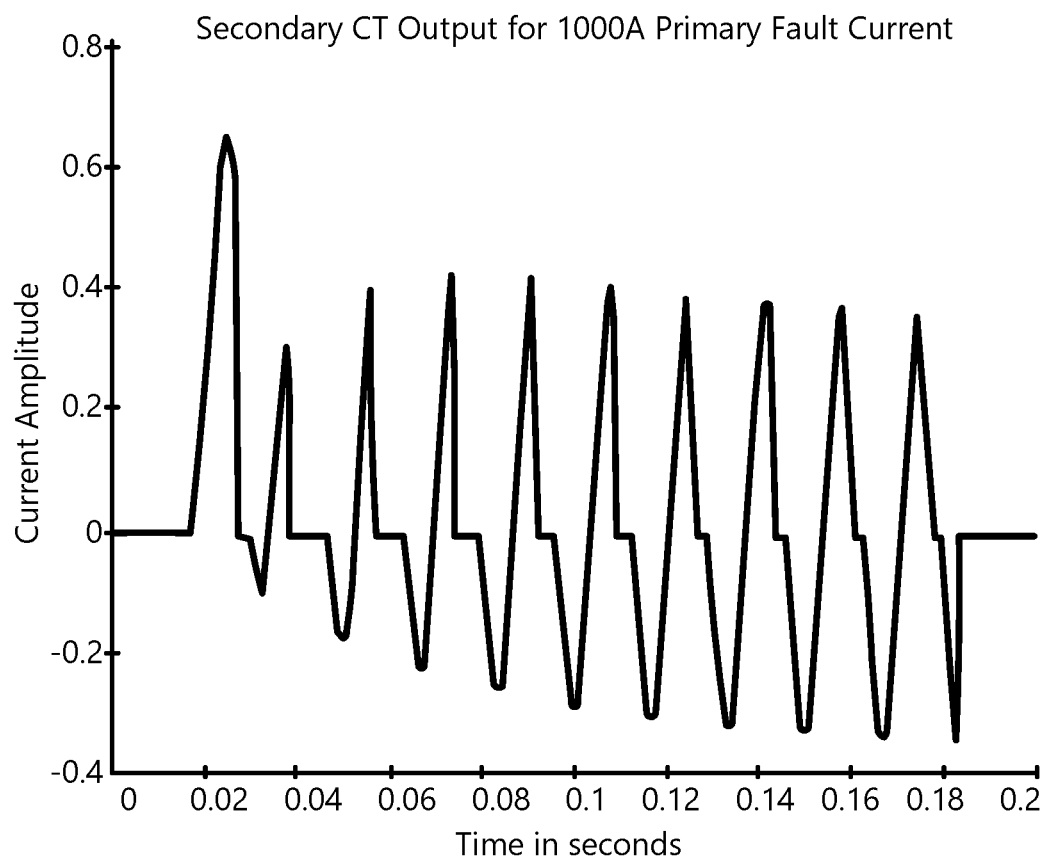
FIGS. 2A, 2B, and 2C illustrate secondary current signals from a current transformer (CT) during saturation.
Figure 2B:
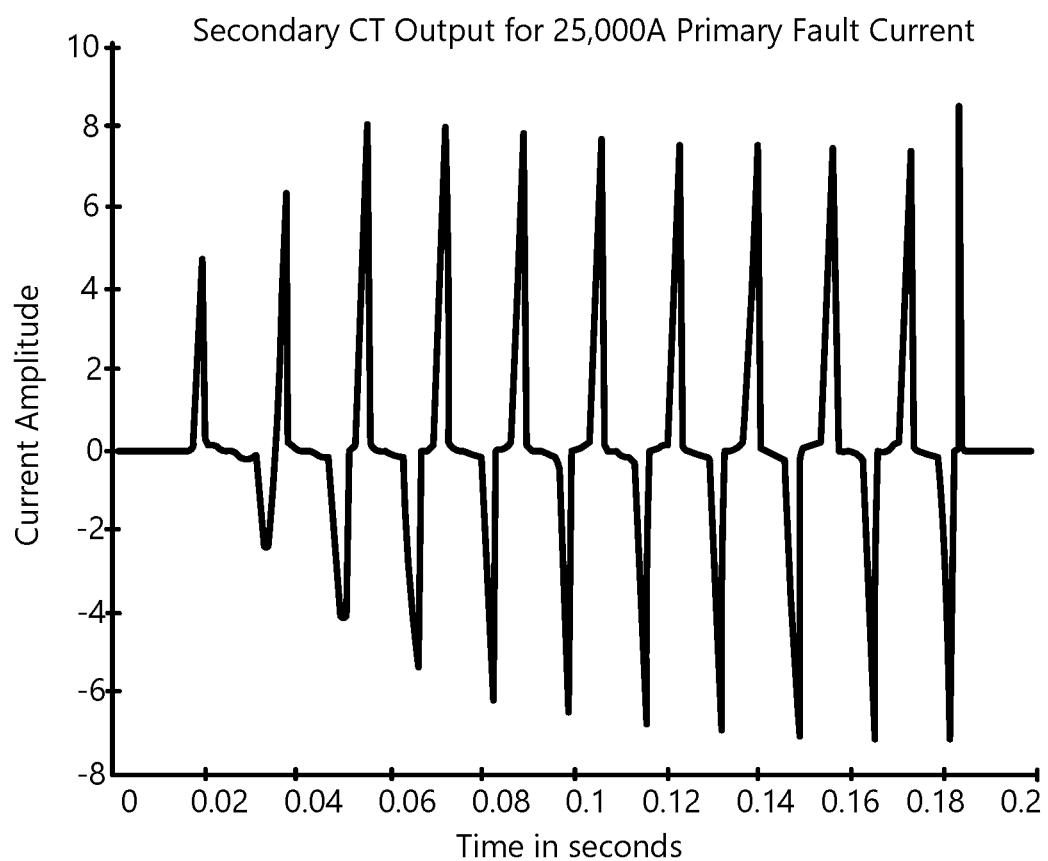

As suggested above, LMDs often include measuring CTs of a physical configuration that exhibit saturation under current conditions that exceed the nominal current condition of the electric power delivery system or approach fault current magnitude. FIG. 2A illustrates a plot of a secondary current signal from a saturated CT of an LMD during a 1000 A primary fault condition. As can be seen, the CT saturates leading to a distorted current signal. Similarly, FIG. 2B illustrates a plot of a secondary current signal from a saturated CT of an LMD during a 25,000 A primary fault condition. The evidence of saturation of the CT is even more evident than the saturation illustrated in FIG. 2A given the distortion present in the secondary signal. Clearly, the sinusoidal current waveform is not represented by the current secondary from the saturated CT.

Various methods have been designed to compensate for, or make use of a signal provided by a CT during saturation. Some techniques make use of the unsaturated region data of the sampled waveform to estimate data points of the saturated region that were distorted by the CT saturation. In accordance with certain techniques, the saturated region may be computed, while in other techniques, the unsaturated region may be computed. When one of the two regions is determined, the other region may also be determined, and used in various protection and monitoring operations. Traditional methods to determine saturated regions may use the third derivative, second harmonic, and fifth harmonic of the current waveform, but are computationally expensive.

Figure 2C:
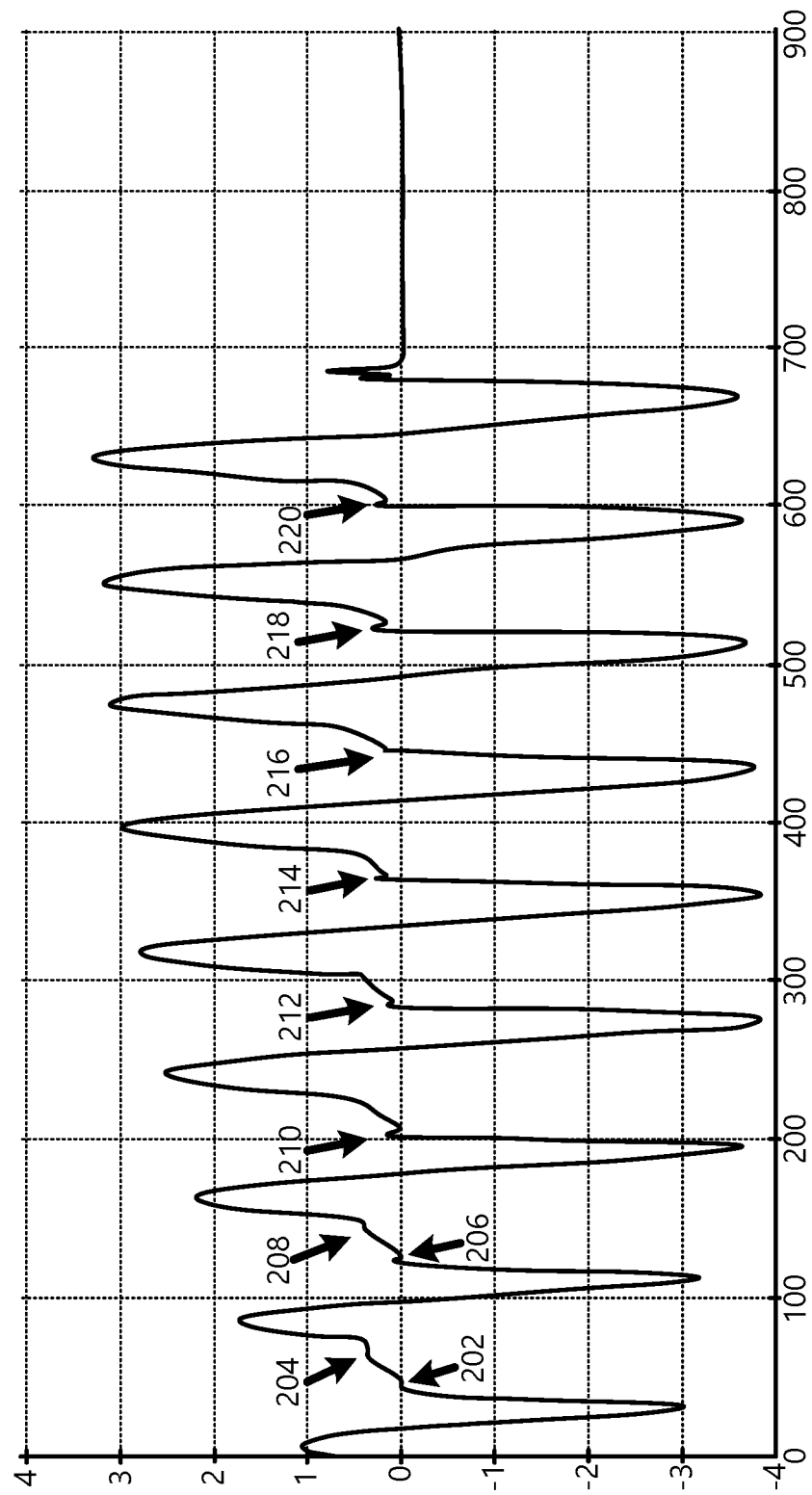

As described below, the techniques described herein determine the positive (maximum) and negative (minimum) peaks of the sampled waveform. With the peaks, the unsaturated regions are determined by taking an interval prior to the peaks. Peaks may be found using the first derivative. However, use of the first derivative may give incorrect results because saturated waveforms often exhibit fictitious maximum and minimum peaks. FIG. 2C illustrates a current waveform during CT saturation. False negative (minimum) peaks 202, 206, and false positive (maximum) peaks 204, 208, 210, 212, 214, 216, 218, and 220 are indicated. Use of the first derivative would include the false positive and negative peaks, resulting in an improper representation of the unsaturated current waveform. Accordingly, the embodiments herein describe computationally efficient methods to use a current waveform from a saturated CT using peaks determined using the first derivatives with fictitious peaks removed. Unsaturated regions are then determined by calculating an interval prior to the peaks based on a factor of the peak values.

Figure 3:
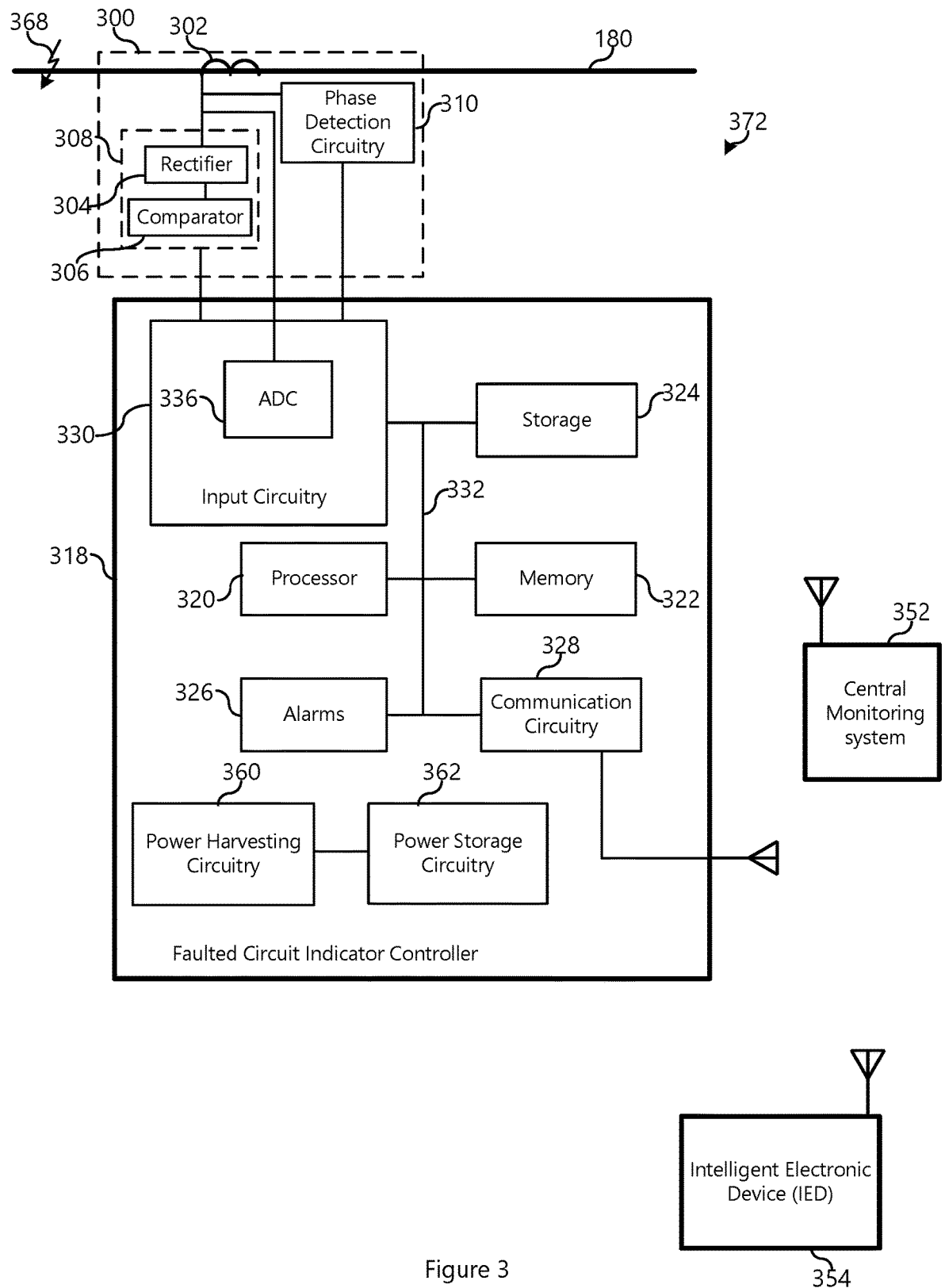
FIG. 3 illustrates a simplified block diagram of a line-mounted sensor according to several embodiments herein.

FIG. 3 illustrates a simplified block diagram of an LMD 372 obtaining current measurements from feeder 180, and determine a fault current magnitude even under saturated CT conditions according to several embodiments herein. The LMD 372 may refer to any of the LMDs 152, 154, 156, 158, 160, or 162 discussed above. The LMD 372 may include sensor circuitry 300 configured to obtain a current signal from the feeder 180. The sensor circuitry 300 may include one or more CTs 302 operatively coupled to the feeder 180 such that current through the feeder 180 induces current through the CT 302 proportional to current through the feeder 180 under unsaturated conditions. The sensor circuitry 300 may further include threshold detection circuitry 308 and phase detection circuitry 310. The threshold detection circuitry 308 may have a rectifier 304 that rectifies the current signals from the CT 302 and a comparator 306 electrically coupled to an output of the rectifier 304. The comparator 306 may compare the rectified signal to a threshold to detect an occurrence of an event such as fault 368. As suggested herein, the CT may provide an accurate secondary current signal during nominal conditions but a distorted secondary current signal during saturated conditions (such as, for example, during an overcurrent condition).

The line sensor 372 may include a controller 318, such as a microcontroller, having one or more processor(s) 320, memory 322 and/or nonvolatile storage 324, one or more alarms 326, communication circuitry 328, input circuitry 330, or any combination thereof. Each of the processor 320, the memory 322, the storage 324, the alarms 326, the communication circuitry 328, and the input circuitry 330 may be communicatively coupled by one or more communication busses 332. In the illustrated embodiment, the input circuitry 330 may receive the output from the comparator 306. For example, the comparator 306 may output a digital signal to the input circuitry 330 based on the comparison between the threshold and the rectified signal to indicate the occurrence of the event 368.

In the illustrated embodiment, the line sensor 372 includes one or more analog to digital (ND) converters 336 that receive an analog signal from the current transformer 302 or another current transformer and convert the analog signal into a digital signal. The A/D converter 336 may multiplex, sample, and/or digitize the measured current and/or voltage signals to form corresponding digitized current and/or voltage signals. For example, the ND converter 336 may monitor an analog signal indicative of the operating parameter on the feeder 180 and output a digital signal representing the operating parameter on the feeder 180.

The processor 320 and/or other data processing circuitry may be operably coupled with the memory 322 and/or the nonvolatile storage 324 to perform various operations. Such programs or instructions executed by the processor 320 may be stored in any suitable article of manufacture that may include one or more tangible, computer-readable media at least collectively storing the instructions or routines, such as the memory 322 and the nonvolatile storage 324. The memory 322 and the nonvolatile storage 324 may include any suitable articles of manufacture for storing data and executable instructions, such as random-access memory, read-only memory, rewritable flash memory, hard drives, or any other suitable optical, magnetic, or solid-state storage medium, or a combination thereof. In some embodiments, the processor 320, the memory 322, and/or the nonvolatile storage 324 may be implemented as hardware components, such as via discrete electrical components, via a field programmable gate array (FPGA), and/or via one or more application specific integrated circuits (ASICs). The processor 320 may be embodied as one or more general-purpose microprocessors, one or more special-purpose microprocessors, a general purpose integrated circuit, an ASIC, an FPGA, and/or other programmable logic devices.

The input circuitry 330, such as the ND converter 336, may be operatively coupled to the processor 320 (e.g., via the communication bus 332 or another bus), through which digitized representations of current and/or voltage signals may be transmitted to the processor 320. The processor 320 may analyze the event 368 based on the digitized representations of current using instructions stored in the memory 322. The processor 320 may then provide a signal indicating the occurrence of the event 368. In certain embodiments, the processor 320 may send a signal to the alarm 326 to indicate the event 368 occurrence. The alarm 326 may provide an audio alert, a visual alert (e.g., LEDs), or the like. The processor 320 may send a signal to the communication circuitry 328 to output a wireless signal to an electronic device to indicate that the event 368 has occurred or is ongoing. In some embodiments, the communication circuitry 328 may include a transceiver that receives and/or transmits data to enable the processor 320 to communicate with other electronic devices. For instance, the processor 320 may communicate, via a communication network with a central monitoring system 352, such as a supervisory control and data acquisition (SCADA) system and/or a wide area control and situational awareness (WACSA) system.

The central monitoring system 352 may provide protective operations for the power transmission and distribution system.

The processor 320 may communicate, via a communication network and/or via direct radio signals sent by the transceiver, with one or more IEDs 354. The IED 354 may be remote from the central monitoring system 352 and may communicate directly or over the communication network with the central monitoring system 352 and/or one or more other IEDs.

In certain embodiments, the LMD 372 may communicate via radio signals with an intermediary device which transmits information to IEDs, SCADA, WACSA, or similar monitoring systems. An intermediate device may be in radio communication with several line-mounted devices, and transmit information therefrom to IEDs, SCADA, WACSA, or similar monitoring systems.

The LMD 372 may include power harvesting circuitry 360 (e.g., current transformers coupled to the power line 358, photovoltaic cells, etc.) and/or power storage circuitry 362 (e.g., battery cells, capacitors, supercapacitors, and the like) to store, for example, the harvested energy. Electric power for the energy harvesting circuitry 360 may be obtained using CT 302. The power harvesting circuitry 360 and/or the power storage circuitry 362 may provide power to the LMD 372 to enable the LMD 372 to monitor the feeder 180 and provide an indication of the event 368.

The LMD 372 may be a wireless line sensor that is powered with the power harvesting circuitry 360 and/or the power storage circuitry 362. The power harvesting circuitry 360 of wireless line sensors may be limited in which the line sensor 372 is powered via the current transformer 302 or another current transformer without being directly electrically coupled to the power grid. That is, alternating current on the feeder 180 may produce a magnetic field that magnetically induces alternating current in the current transformer 302 (e.g., through a core), harvested by the power harvesting circuitry 360, to power each of the operations of LMD 372 without additional sources of power other than the power harvesting circuitry 360 and/or the power storage circuitry 362 (e.g., without directly conducting electrical energy via a conductor directly electrically coupled to the power grid). In other embodiments, the power harvesting circuitry 360 may harvest power via photovoltaic cells. The power storage circuitry 362 may include one or more battery cells, capacitors, supercapacitors, or the like, to store energy from the power harvesting circuitry 360 to power the LMD 372. In some embodiments, the LMD 372 may perform each of the operations described herein using power from the power harvesting circuitry 360 and/or power storage circuitry 362 without additional power sources.

Because power to perform operations may be limited on the LMD 372 based on the power harvesting circuitry 360 and/or the power storage circuitry 362, it may be desirable for the LMD 372 to conserve power. Line sensors that continuously monitor samples (e.g., sampling 3, 4, 5, 10, 20, or more samples within a period) of the current during normal operation may utilize significant power. As described below, embodiments consistent with the present disclosure may improve line sensor technology by determining a fault and fault current magnitude of the event without continuously monitoring the current during normal operations (e.g., operations prior to or without an event). By determining a fault current magnitude of the event while limiting power consumption, additional functionality of the wireless line sensor technology may be enabled in which the LMD 372 provides or stores an indication of the event.

The phase detection circuitry 310 may monitor a feature of the operating parameter, such as changes in the current or voltage. In the illustrated embodiment, the phase detection circuitry 310 may monitor a time at which a feature, such as a zero crossing of the current, a zero crossing of the voltage, a peak (e.g., maximum and/or minimum) of the current, or a peak (e.g., maximum and/or minimum) of the voltage, occurs.

The phase detection circuitry 310 may send an activation signal to activate (e.g., wake up) the controller 318 to enable the controller 318 to store a time stamp associated with each zero crossing. For example, the phase detection circuitry 310 may activate, via hardware interrupts, the controller 318 at each rising edge (e.g., from negative phase to positive phase) and/or falling edge (e.g., from positive phase to negative phase). Upon activation, the controller 318 may record a time stamp associated with the rising edge and/or falling edge and be deactivated until reactivated.

Prior to the event, the controller 318 may be in a sleep mode or in a low power mode, referred to herein as being in a pre-event mode, in which the controller 318 may not measure samples of the magnitude of the current on the feeder 180 to conserve power. That is, the controller 318 may be activated to record time stamps of the zero crossing but may not sample the magnitude of the current or may otherwise be inactive in the pre-event mode. For instance, by being activated to record the time stamps of zero crossings (e.g., awake 60 times per second for a 60 hz signal). For example, the controller 318 may begin in an inactive state. Upon occurrence of a zero crossing, the phase detection circuitry 310 may send the activation signal to the controller 318 to activate the controller 320. The processor 320 may record a time stamp of the zero crossing based upon the activation signal and return to being inactive. The controller 318 may repeat this process while operating in the pre-event mode to conserve power by the controller 318 being inactive other than during the zero crossings.

The controller 318 may receive an event signal from the threshold detection circuitry 308 indicating the occurrence of the event 368 due to current exceeding a threshold. The controller 318 may activate upon receiving the event signal and operate in an event mode in which the controller 318 is active, awake, on, or in a high power mode that utilizes more power than the low power mode (e.g., due to being active for longer periods than when active in the pre-event mode) prior to the event. The controller 318 may then measure samples of the current of the feeder 180. In some embodiments, the controller 318 may measure repeated samples (e.g., 8, 16, 32, or more samples), in the event mode, during or following the event 368 to analyze the event 368. That is, the controller 318 may not take any samples of current magnitude prior to the event 368 but may be active to record zero crossings and, upon receipt of the event signal, transition to the event mode and take repeated samples. In other embodiments, the controller 318 may take fewer samples prior to the occurrence of the event 368 than during the occurrence of the event 368. Further, the processor 320 may determine the times at which the zero crossings occurred from the activations by the phase detection circuitry 310 and store the times in the memory 322 and/or nonvolatile storage 324. Based on the zero crossings prior to the event 368 and the repeated samples during or following the event 368, the processor 320 may determine a fault current magnitude of the event 368 even without samples obtained prior to the event, and even under saturated CT conditions.

Figure 4:
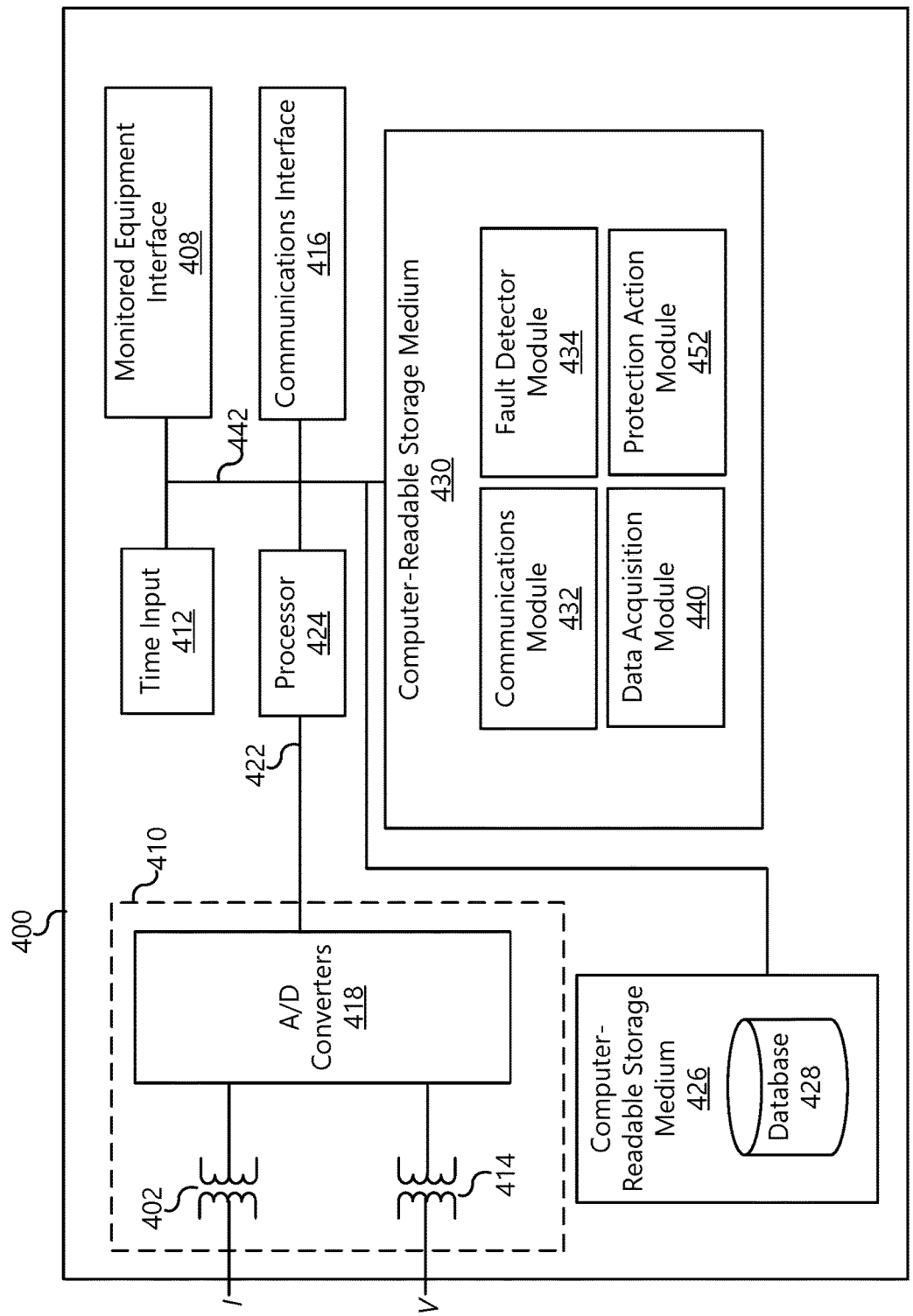
FIG. 4 illustrates a simplified functional block diagram of an intelligent electronic device (IED) in accordance with several embodiments herein.

FIG. 4 illustrates a simplified block diagram of an IED 400 for monitoring or protecting at least a portion of the electric power delivery system. Any of IEDs 174, 176, 178 of FIG. 1 may be configured similarly to IED 400. As has been suggested above, IED 400 may be configured to obtain electric power system signals from equipment of the electric power delivery system.

IED 400 includes a communications interface 416 configured to communicate with devices (such as line-mounted devices or intermediary devices) and/or IEDs. In certain embodiments, the communications interface 416 may facilitate direct communication with devices and other IEDs or communicate with systems over a communications network. According to various embodiments, the communications interface 416 may be configured to communicate via radio communications, and include an antenna for radio communications. IED 400 may further include a time input 412, which may be used to receive a time signal (e.g., a common time reference) allowing IED 400 to apply a time stamp to the acquired samples. In certain embodiments, a common time reference may be received via communications interface 416, and accordingly, a separate time input may not be required for time stamping and/or synchronization operations. One such embodiment may employ the IEEE 1588 protocol.

A monitored equipment interface 408 may be configured to receive status information from, and issue control instructions to, a piece of monitored equipment (such as a circuit breaker, conductor, transformer, or the like). In various embodiments, IED 400 may be configured to effect a control or protection operation on an electric power delivery system using the monitored equipment interface 408. Upon detection of an event, the IED 400 may be configured to issue a signal to the monitored equipment to perform a function via the monitored equipment interface 408. For example, upon detection of a fault within a zone of protection of the IED 400, the IED may signal a circuit breaker to open to remove electric power from a portion of the electric power delivery system.

Processor 424 may be configured to process communications received via communications interface 416, time input 412, and/or monitored equipment interface 408. Processor 424 may operate using any number of processing rates and architectures. Processor 424 may be configured to perform various algorithms and calculations described herein. Processor 424 may be embodied as a general purpose integrated circuit, an application specific integrated circuit, a field-programmable gate array, and/or any other suitable programmable logic device.

In certain embodiments, IED 400 may include a sensor component 410. In the illustrated embodiment, sensor component 410 is configured to gather data directly from conventional electric power system equipment such as a conductor (not shown) using conventional PTs and/or CTs. The sensor component 410 may use, for example, transformers 402 and 414 and ND converters 418 that may sample and/or digitize filtered waveforms to form corresponding digitized current and voltage signals provided to data bus 422. Current (I) and voltage (V) inputs may be secondary inputs from conventional instrument transformers such as, CTs and VTs. A/D converters 418 may include a single ND converter or separate ND converters for each incoming signal. A current signal may include separate current signals from each phase of a three-phase electric power system. A/D converters 418 may be connected to processor 424 by way of data bus 422, through which digitized representations of current and voltage signals may be transmitted to processor 424. In various embodiments, the digitized current and voltage signals may be used to calculate time-domain quantities for the detection and the location of a fault on an electric power system as described herein.

A computer-readable storage medium 426 may be the repository of a database 428 containing electric power line properties for each transmission line and/or each section of each transmission line, such as impedances, resistances, propagation times, reactances, lengths, and/or the like. Another computer-readable storage medium 430 may be the repository of various software modules configured to perform any of the methods described herein. A data bus 442 may link monitored equipment interface 408, time input 412, communications interface 416, and computer-readable storage mediums 426 and 430 to processor 424.

Computer-readable storage media 426 and 430 may be separate devices or may be the same medium (i.e. the same disk, the same non-volatile memory device, or the like). Further, the database 428 may be stored in a computer-readable storage medium that is not part of the IED 400, but that is accessible to IED 400 using, for example, communications interface 416.

Communications module 432 may be configured to allow IED 400 to communicate with any of a variety of external devices via communications interface 416. Communications module 432 may be configured for communication using a variety of data communication protocols (e.g., UDP over Ethernet, IEC 61850, etc.).

Data acquisition module 440 may collect data samples such as the current and voltage quantities and the incremental quantities. The data samples may be associated with a timestamp and made available for retrieval and/or transmission to a remote IED via communications interface 416. Data acquisition module 440 may operate in conjunction with fault detector module 434. Data acquisition module 440 may control recording of data used by the fault detector module 434. According to one embodiment, data acquisition module 440 may selectively store and retrieve data and may make the data available for further processing. Such processing may include processing by fault detector module 434, which may be configured to determine the occurrence of a fault with an electric power distribution system.

A protective action module 452 may be configured to implement a protective action based on the declaration of a fault by the fault detector module 434. In various embodiments, a protective action may include tripping a breaker, selectively isolating a portion of the electric power system, etc. In various embodiments, the protective action module 452 may coordinate protective actions with other devices in communication with IED 400.

As is illustrated and described, line-mounted devices may be installed in a somewhat distributed manner on conductors in an electric power delivery system. The line-mounted devices may monitor current on the conductor, determine current levels, determine fault conditions, and communicate such information back to an IED or supervisory system either directly or indirectly through intermediary devices, communication networks, and the like. Furthermore, line-mounted devices may be configured to operate using electric power harvested from the conductor, onboard power sources, or the like. To conserve electric power for operation, the line-mounted device may be configured to reduce the amount of electric power used by its various components. To that end, the line-mounted device may be configured to operate with the processor in a low-power mode unless certain conditions are detected. As illustrated in FIG. 3, the line-mounted device may use sensor circuitry to determine phase, compare current magnitude to a threshold, filter the current signal, and the like. The processor 320 may be activated to record time stamps of zero crossings determined by the phase detection circuitry 310. The processor 320 may be activated upon determination of a fault condition by the comparator 306, at which time the processor may be active to record sampled current signals, determine fault conditions, determine a direction to the fault, determine a fault magnitude, effect communication, and the like. Otherwise, the processor 320 may remain in low-power or pre-event mode without continuously sampling the current signal.

In accordance with several embodiments hereof, an LMD may remain in a low-power mode during nominal operation of the power system. That is, while the primary current remains at a nominal level, the LMD may refrain from transmitting samples, or transmit only periodically. The LMD may monitor for zero-crossings using hardware, and mark times of zero-crossings such that a frequency of the power system may be determined therefrom upon the LMD entering normal operation from the low-power mode. Phase detection circuitry 310 may be used to activate the controller 318 to obtain the time stamps of the zero crossings. The controller 318 may record the time stamps of the zero crossings.

Upon detection of current exceeding a threshold, the line-mounted device may detect an overcurrent fault, and determine the fault magnitude for transmission to an IED or supervisory system for protection and monitoring functions. As described above, the CT may become saturated, such that the fault magnitude cannot be measured directly using the secondary signals therefrom. To determine the fault magnitude even during CT saturation, the line-mounted device may: 1) time stamp zero crossing of the pre-event current and determine the power system period and frequency; 2) when the current magnitude exceeds a predetermined threshold, time stamp the instant that the threshold is crossed, and start sampling the current; 3) find the maximum and minimum peaks using the methods described herein; 4) find the unsaturated region of samples depending on the maximum or minimum peaks; and 5) determine the fault magnitude using the unsaturated region. The fault magnitude may be calculated using various methods, such as, for example, 1) determining data pairs of samples within the unsaturated regions in consecutive cycles; 2) determining direct current (DC) component parameters; 3) removing DC components from the samples; and 4) determining the fault magnitude with the DC components removed. Additional details on the determination of the peaks, unsaturated regions, and saturated regions are provided herein. Further, additional details on the calculation of the fault magnitude in accordance with several embodiments are provided herein.

The processor 320 may retrieve the time stamps of rising zero crossings of the pre-event current from the memory 322 and/or the non-volatile storage 324. The processor 320 may determine a period (or frequency) of the pre-event current based on the time stamps of the rising edge zero crossings. In an embodiment, the processor 320 may utilize a moving average filter to determine the period. For example, a low pass filter (which may be implemented in the processor 320, or may be implemented in hardware in, for example, the input circuitry 330) having a moving average of time between each of the rising zero crossings may be implemented according to Equation 1:

$$T_{average}[n] = \frac{1}{4}(t_s[n] - t_s[n-4]) \quad \text{Eq. 1}$$

$$f = \frac{1}{T_{average}[n]}$$

where $t_s$ represents the time stamps of the rising edge zero crossings of the nth sample. Note that while rising edge zero crossings are used as an example, falling edge or a combination of both may be used.

At time $t_f$, the sensor circuitry 300 may detect an occurrence of the event 368 by determining that measured current has exceeded a current threshold ($I_{TH}$). Upon determining that the measured current exceeds $I_{TH}$, the sensor circuitry 300 may send the event signal to the controller 318 to activate the controller 318 to operate in the event mode from operating in the pre-event mode. The processor 320 may begin repeatedly sampling the fault current for one or more cycles (e.g., 2.5 cycles, 3 cycles, 5 cycles, 6 cycles, 10 cycles, etc.). The processor 320 may obtain the first sample $s_1$ at time $t_{fs}$ according to Equation 2:

$$t_{fs} = t_s[n] + m_{min} * \frac{T_{average}[n]}{N} \qquad \text{Eq. 2}$$

where $t_s[n]$ is the last time stamp of the zero crossing of current prior to the event;

N is the total number of samples per cycle;

$T_{average}[n]$ is derived from equation (1); and, $m_{min}$ is the smallest integer number in which $t_{fs} < t_f$ where $t_f$ refers to the time at which the current threshold is exceeded.

The sampling frequency ($f_{samp}$) selected may depend on the period to obtain a given number of samples per cycle.

1.928 kHz. While the table provides example sampling frequencies, these are simply meant to be illustrative and any suitable sampling frequency may be used.

Upon detection of the fault condition, the first step in determining the fault magnitude in accordance with the present disclosure is to sample the current values and maintain a sequence of sampled values. The sequence of sampled values are denoted as s(i) at the chosen frequency and may follow:

$$s(i) = s(t_{fs} + iT_{average}[n]) \qquad \text{Eq. 3}$$

where m is the integer sample (e.g., m=0, 1, 2, . . . ).

With the sequence of sampled values, the processor may proceed to the second step, calculating maximum peak values and minimum peak values of the sampled waveform. The peaks may be calculated by detecting a change in sign of the first derivative of the current signal. A computationally efficient way to calculate the change in sign of the first derivative is to determine a change in sign between successive differences in consecutive samples. For example, sample s(i) is a maximum peak if the condition represented in Equation 4 is satisfied:

$$s(i-1) - s(i) < 0$$

and $$s(i) - s(i+1) \geq 0 \qquad \text{Eq. 4}$$

Similarly, sample s(i) is a minimum peak if the condition represented in Equation 5 is satisfied:

$$s(i-1) - s(i) > 0$$

and $$s(i) - s(i+1) \leq 0 \qquad \text{Eq. 5}$$

TABLE 1

Example sampling frequencies ($f_{samp}$).

| Frequency range (Hz) | | Period range (ms) | | Sampling frequency for 32 samples per cycle (kHz) | Sampling frequency for 64 samples per cycle (kHz) | Sampling frequency for 128 samples per cycle (kHz) |
|---|---|---|---|---|---|---|
| 64.75 | 65.25 | 15.44 | 15.33 | 2.088 | 4.176 | 8.352 |
| 64.25 | 64.75 | 15.56 | 15.44 | 2.072 | 4.144 | 8.288 |
| 63.75 | 64.25 | 15.69 | 15.56 | 2.056 | 4.112 | 8.224 |
| 63.25 | 63.75 | 15.81 | 15.69 | 2.04 | 4.08 | 8.16 |
| 62.75 | 63.25 | 15.94 | 15.81 | 2.024 | 4.048 | 8.096 |
| 62.25 | 62.75 | 16.06 | 15.94 | 2.008 | 4.016 | 8.032 |
| 61.75 | 62.25 | 16.19 | 16.06 | 1.992 | 3.984 | 7.968 |
| 61.25 | 61.75 | 16.33 | 16.19 | 1.976 | 3.952 | 7.904 |
| 60.75 | 61.25 | 16.46 | 16.33 | 1.96 | 3.92 | 7.84 |
| 60.25 | 60.75 | 16.60 | 16.46 | 1.944 | 3.888 | 7.776 |
| 59.75 | 60.25 | 16.74 | 16.60 | 1.928 | 3.856 | 7.712 |
| 59.25 | 59.75 | 16.88 | 16.74 | 1.912 | 3.824 | 7.648 |
| 58.75 | 59.25 | 17.02 | 16.88 | 1.896 | 3.792 | 7.584 |
| 58.25 | 58.75 | 17.17 | 17.02 | 1.88 | 3.76 | 7.52 |
| 57.75 | 58.25 | 17.32 | 17.17 | 1.864 | 3.728 | 7.456 |
| 57.25 | 57.75 | 17.47 | 17.32 | 1.848 | 3.696 | 7.392 |
| 56.75 | 57.25 | 17.62 | 17.47 | 1.832 | 3.664 | 7.328 |
| 56.25 | 56.75 | 17.78 | 17.62 | 1.816 | 3.632 | 7.264 |
| 55.75 | 56.25 | 17.94 | 17.78 | 1.8 | 3.6 | 7.2 |
| 55.25 | 55.75 | 18.10 | 17.94 | 1.784 | 3.568 | 7.136 |
| 54.75 | 55.25 | 18.26 | 18.10 | 1.768 | 3.536 | 7.072 |

For example, a sampling frequency for a system frequency between 59.75 Hz and 60.25 Hz (i.e., a period of approximately 16.60 ms to 16.74 ms) with 32 samples per cycle may have a sampling frequency of approximately As is illustrated in FIG. 2C, the maximum and minimum peaks determined using the conditions in Equations 4 and 5 may result in misidentification of maximum and minimum peaks. The false peaks 202-220 as well as the true maximum and minimum peaks would be identified as maxima and minima. Accordingly, what is needed is a computationally efficient method of removing falsely identified samples as maxima and minima.

The third step is to determine the threshold to remove fictitious peaks. The threshold may be determined as an average of the peak values. The average may be determined over the number of cycles of sampled data, number of peaks, or a maximum of the number of cycles of sampled data and number of peaks. In various embodiments, the threshold may be calculated in accordance with Equation 6:

$$\text{Threshold} = \frac{TotalSum}{2*M} \quad \text{Eq. 6}$$

where:
TotalSum is the sum of peak values over the data vector; and,
M is the maximum of the number of cycles of sampled data in the data vector and the number of peaks computed in the second step.

Once the threshold is determined, the fourth step of removing fictitious peaks may be performed. In accordance with one embodiment, two criteria may be used to remove fictitious peaks. In some embodiments the peak must be removed as a fictitious peak if the peak meets both criteria, whereas in other embodiments the peak must be removed as a fictitious peak if the peak meets at least one criterion. One criterion for a real peak is that it must be greater than or equal to the threshold determined in the third step for maximum peaks, and smaller than or equal to the threshold for minimum peaks. Another criterion may be that the value of the sample at the peak must exceed for maximum peaks (or be less than for minimum peaks) a sample value that is a number of samples away from the peak value under test. For example, real peaks must be greater than a sampled point that is K samples away from the peaks for maximum peaks and smaller than a sampled point that is K samples away from the peaks. The value of K may be selected as less than N/2, where N is the number of samples per cycle. The following example illustrates one embodiment of an application of these four steps.

Figure 5:
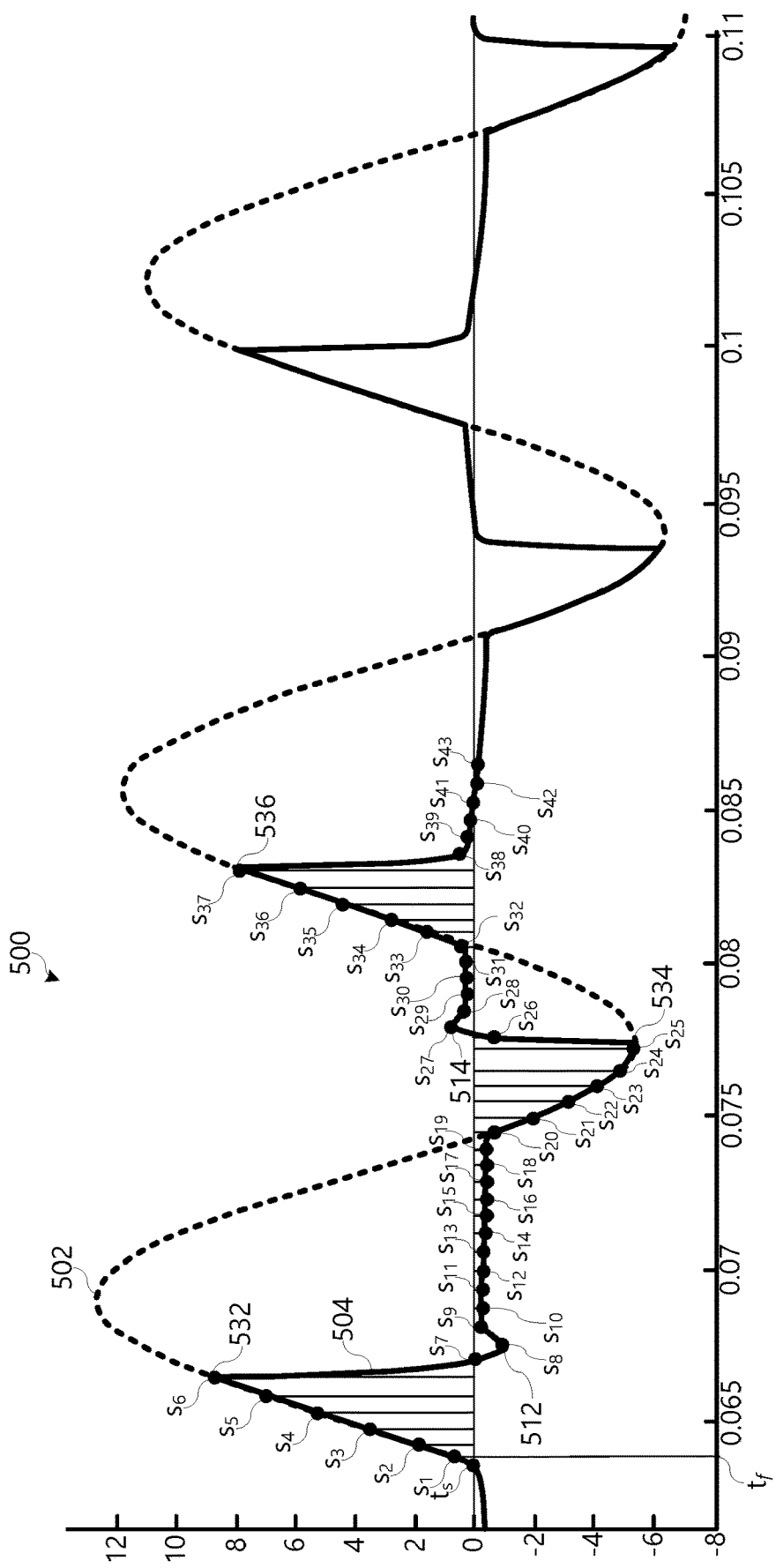
FIG. 5 illustrates a current signal from a saturated CT along with points useful for determining the saturated portion in accordance with several embodiments herein.

FIG. 5 illustrates a current waveform 500 captured by a line-mounted device with a CT that has been saturated by an overcurrent condition. The LMD is configured to sample at a rate of 32 samples per cycle upon detection of a fault condition, and the sample values are indicated as $s_1$ through $s_{32}$. As can be seen, a secondary current without a saturated CT would appear as trace 502. However, due to the CT saturation, the measured secondary current is represented by trace 504. In step one, at time $t_f$ an overcurrent condition is detected, the processor enters active mode, and sampling begins with sample $s_1$. Peaks are determined in step two. As mentioned above, both true peaks (532, 534) and false peaks (512, 514) are exhibited in the set of samples taken from the saturated CT. Peaks are identified using the change in sign between sequential differences of consecutive samples. That is, maximum peak 532 corresponding with sample $s_6$ is found because its value satisfies Equation 4 as follows:

$$s_5 - s_6 < 0$$

and $$s_6 - s_7 \geq 0$$

Similarly, minimum peak 534 corresponding with sample $s_{25}$ is found because its value satisfies Equation 5 as follows:

$$s_{24} - s_{25} > 0$$

and $$s_{25} - s_{26} \leq 0$$

However, a minimum peak 512 corresponding with $s_8$ is also found because its value also satisfies Equation 5 as follows:

$$s_7 - s_8 > 0$$

and $$s_8 - s_9 \leq 0$$

Similarly, a maximum peak 514 corresponding with $s_{27}$ is also found because its value also satisfies Equation 4 as follows:

$$s_{26} - s_{27} < 0$$

and $$s_{27} - s_{28} \geq 0$$

Accordingly, the identified maximum peak samples include $s_6$ and $s_{27}$, and the identified minimum peak samples include $s_8$ and $s_{25}$.

In the third step, the threshold value for fictitious peak removal is calculated. For minimum peaks, the threshold is equal to the sum of the peak values over 2*M, as described above; and for maximum peaks, the threshold is equal to the sum of the peak values over 2*M. In the illustrated example, M is the maximum between the number of cycles sampled (1) and the number of peaks found (4). Accordingly, the maximum and minimum thresholds in the illustrated embodiment are calculated in accordance with Equation 7:

$$\text{Minimum Threshold} = \frac{s_8 + s_{25}}{4} \quad \text{Eq. 7}$$

and $$\text{Maximum Threshold} = \frac{s_6 + s_{27}}{4}$$

In the fourth step, the fictitious minimum and maximum peaks are removed. In one embodiment, the fictitious minimum peak at sample $s_8$ may be removed from the list of minimum peaks if it meets both criteria; and the fictitious maximum peak at sample $s_{27}$ may be removed if it meets both criteria. In another embodiment, the fictitious minimum peak at sample $s_8$ may be removed from the list of minimum peaks if it meets either of the criteria; and the fictitious maximum peak at sample $s_{27}$ may be removed if it meets either of the criteria. The first criteria is to remove the sample as a minimum if it is greater than the minimum threshold calculated in Equation 7; and to remove the sample as a maximum if it is less than the maximum threshold calculated in Equation 7.

In accordance with the second criterion, the maximum peaks may be removed if the values thereof are not greater than a sample that is K samples away from the maximum peak; and the minimum peaks may be removed if the values thereof are not less than a sample that is K samples away from the minimum peak. Where the number of samples per cycle is 32 as illustrated, the selected K value must be less than 16. If a K value of 14 is selected, then in accordance with the first and second criteria, the following conditions must be met in order to retain the samples previously identified as peak values:

$s_6$ is retained as a maximum peak if both:

$$s_6 \geq \frac{s_6 + s_{27}}{4}$$

$$s_6 > s_{20}$$

Otherwise, s6 is removed as a maximum peak
$s_{27}$ is retained as a maximum peak if both:

$$s_{27} \geq \frac{s_6 + s_{27}}{4}$$

$$s_{27} > s_{41}$$

Otherwise, $s_{27}$ is removed as a maximum peak
$s_8$ is retained as a minimum peak if both:

$$s_8 \leq \frac{s_8 + s_{25}}{4}$$

$$s_8 < s_{22}$$

Otherwise, $s_8$ is removed as a minimum peak
$s_{25}$ is retained as a minimum peak if both:

$$s_{25} \leq \frac{s_8 + s_{25}}{4}$$

$$s_{25} < s_{39}$$

Otherwise, $s_{25}$ is removed as a minimum peak

At least because $s_8$ is clearly not less than $s_{22}$, $s_8$ is removed as a minimum peak. Similarly, at least because $s_{27}$ is not greater than the calculated maximum threshold, $s_{27}$ is removed as a maximum peak. The sample at $s_6$ is retained as a maximum peak; and the sample at $s_{25}$ is retained as a minimum peak.

With the removal of fictitious peaks, and the list of maximum and minimum peaks, the unsaturated region may be determined for each peak. In accordance with various embodiments, the unsaturated regions may be determined as a region between a first fraction of the peak value and a second fraction of the peak value. The fractions may be predetermined or a setting. In one embodiment, the first fraction is around 30% and the second fraction is around 90%. The first and second fractions may be determined by experiment and provided as a setting before commissioning of the LMD.

In the illustrated embodiment, the unsaturated region of the first maximum peak would include the region between 30% of $s_6$ to 90% of $s_6$; and the unsaturated region of the first minimum peak would be the region between 30% of $s_{25}$ to 90% of $s_{25}$. The unsaturated starting points and unsaturated endpoints are used to determine the unsaturated regions of the CT. It should be understood that the unsaturated region may be determined using different starting points and endpoints (or different fractions). In one embodiment, the second fraction may be around 95% of the peak value. In another embodiment, the first fraction may be around 40% of the peak value. Indeed, different combinations of the fractions may be used.

The determination of the unsaturated regions in accordance with the embodiments herein are less computationally expensive than previous methods to treat samples from saturated CTs. In various embodiments, the saturated region may be determined for use by various other functions of the LMD. For example, with the period of the signal known (from the frequency calculated using zero-crossings), the saturated region of one cycle may be the complement of the determined unsaturated region. For example, if the period is 16.67 ms, then a half-cycle is 8.33 ms. If time is measured from the first zero-crossing, and the unsaturated region of the first peak is from time t=0 to t=4 ms, then the saturated region of the first half-cycle is determined to be from time 4 ms to time 8.33 ms. It should be noted that in certain embodiments the saturated region is not needed to determine the fault magnitude, whereas in other embodiments, the saturated region may be used.

With the unsaturated regions determined, a fault magnitude may be calculated. Using the embodiments herein, therefore, the fault magnitude may even be calculated for a current signal when the CT obtaining the current signal is saturated, and does not deliver a secondary signal representative of the entire waveform of the primary current signal. Significantly, the unsaturated region of the current signal may be determined using computationally efficient methods described herein. The fault magnitude may then be calculated using the unsaturated region. Accordingly, the embodiments herein improve the operation of a line-mounted sensor by improving the computational efficiency of fault magnitude calculation.

Figure 6:
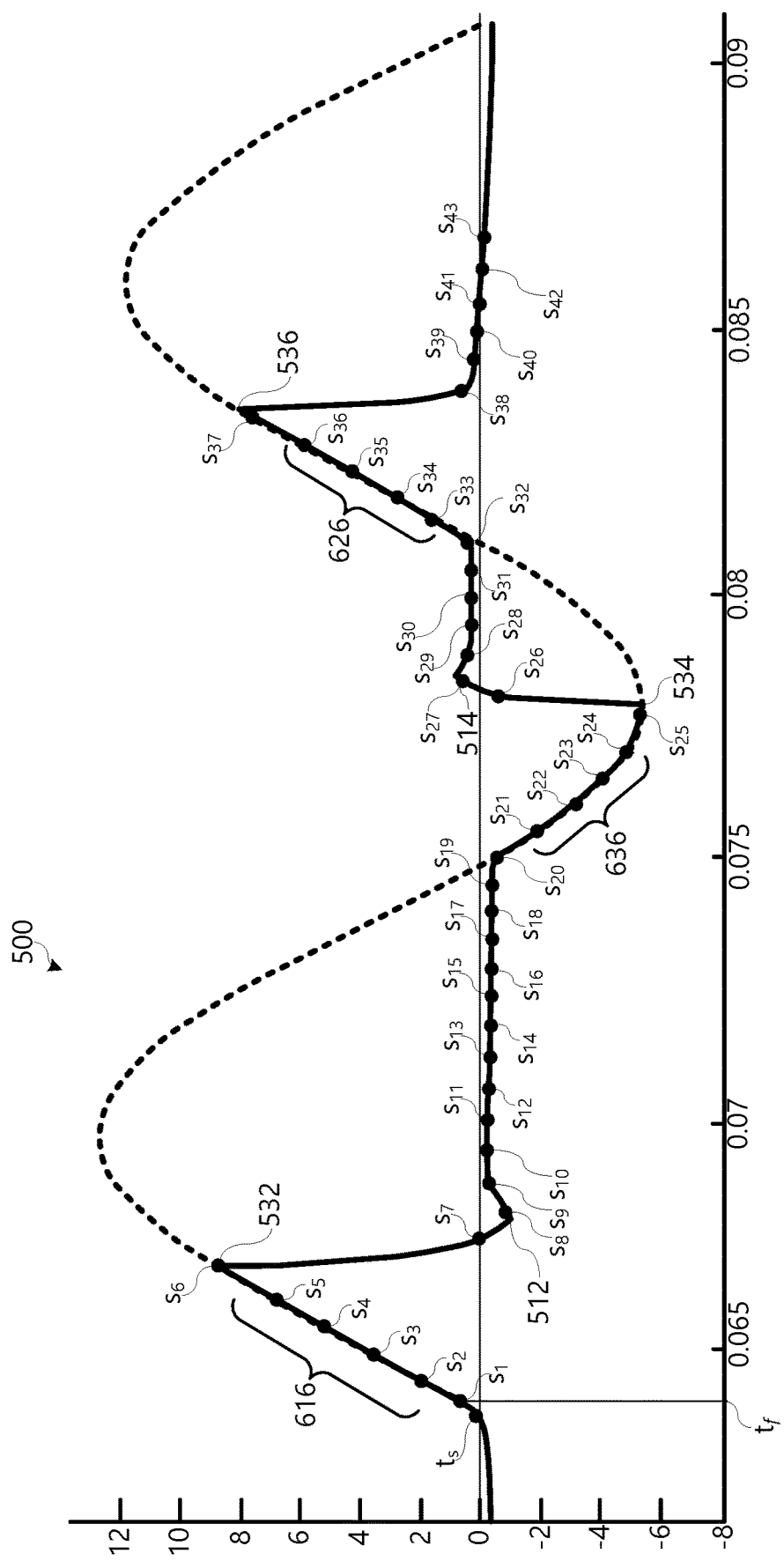
FIG. 6 illustrates a current signal from a saturated CT along with unsaturated zones and sample pairs for calculating signal peaks in accordance with several embodiments herein.

In certain embodiments, the fault magnitude may be calculated using samples within the unsaturated region. For ease of discussion, FIG. 6 is presented, which illustrates a portion of the plot presented in FIG. 5. Using the embodiments described above, a first positive unsaturated region 616 preceding maximum peak 532 is determined, which includes samples $s_2$, $s_3$, $s_4$, and $s_5$. It should be noted that sample $s_6$ is greater than 90% of the determined peak and not included in the unsaturated region 616; and sample $s_1$ is less than 30% of the determined peak and is likewise not included in the unsaturated region. Similarly, a first negative unsaturated region 636 preceding minimum peak 534 is determined using the embodiments above, and includes samples $s_{21}$, $s_{22}$, $s_{23}$, and $s_{24}$. Second positive unsaturated region 626 is determined using peak 536, and include samples $s_{33}$, $s_{34}$, $s_{35}$, and $s_{36}$. Additional unsaturated regions may be determined for further peaks of the signal, however these are sufficient to illustrate the calculation of a fault magnitude.

Valid data pairs may then be selected. A valid data pair is a pair of data points in consecutive cycles, separated by the number of samples per cycle (N) that are each within the respective unsaturated regions. That is, a valid pair meets the following criteria: 1) separated by N samples; and 2) each sample in the pair is within its unsaturated region. In the example illustrated in FIG. 6, valid data pairs include: samples $s_2$ and $s_{34}$; samples $s_3$ and $s_{35}$; and samples $s_4$ and $s_{36}$. Although sample $s_5$ is within the first positive unsaturated region, the sample that is N samples after $s_5$ is $s_{37}$, which is outside of the second positive unsaturated region, resulting in the pair $s_5$ and $s_{37}$ being an invalid pair. Accordingly, in the illustrated embodiment, three valid pairs are found.

According to several embodiments herein, at least two pairs in consecutive cycles are needed to determine the fault magnitude. As the pairs can come from any consecutive cycles, if the first two cycles do not yield at least two pairs, data samples from additional consecutive cycles may be used. For example, samples from the second and third cycle may be examined to determine if at least two valid pairs are found. Similar determinations may be made for subsequent cycles if needed. It should be noted that by increasing the number of samples per cycle (N), more pairs will be available in each unsaturated region. This will increase the likelihood that at least two valid pairs will be found. For purposes of examples herein, the first set of at least two valid pairs is denoted as $N_{pairs}$. Furthermore, if additional pairs are needed to provide sufficient valid pairs, additional sample points may be calculated by interpolating between recorded sample points in the unsaturated regions.

With at least two valid pairs determined, the pairs of samples may be used to calculate DC components of the saturated signal and to calculate the fault magnitude. This calculation may depend on the number of valid pairs found. If the number of valid pairs is 2 ($|N_{pairs}|=2$), then Equations 8 and 9 may be used to determine $M_1$ and $M_2$:

$$M_1 = \begin{bmatrix} 1 & 1 \\ 1 & 2 \end{bmatrix} \quad \text{Eq. 8}$$

$$M_2 = \begin{bmatrix} \cos(2\pi fT) & \sin(2\pi fT) \\ \cos(2*2\pi fT) & \sin(2*2\pi fT) \end{bmatrix} \quad \text{Eq. 9}$$

where:

$$T = \frac{1}{N f_{sample}}$$

is the sampling interval;
$M_1$ is a DC component parameter matrix; and,
$M_2$ is a fault current magnitude matrix.

For the case with two valid pairs, the two data points may be denoted as $N_{pairs}=\{n_1, n_2\}$. The DC component parameters may be calculated using Equations 10-12:

$$S[n]=s[n]-s[n+N] \text{ if maximum peaks are used} \quad \text{Eq. 10A}$$

$$S[n]=s[n+N]-s[n] \text{ if minimum peaks are used} \quad \text{Eq. 10B}$$

$$S_{M1} = \begin{bmatrix} Ln(S[n_1]) \\ Ln(S[n_2]) \end{bmatrix} \quad \text{Eq. 11}$$

$$D_c = \begin{bmatrix} D_{c1} \\ D_{c2} \end{bmatrix} = (M_1^T M_1)^{-1} M_1^T S_{M1} \quad \text{Eq. 12}$$

The DC fault current component can then be calculated using Equation 13:

$$s_{Dc}[n]=\lambda e^{n\alpha} \quad \text{Eq. 13}$$

where:
$\alpha = D_{C2}$;

$$\lambda = \frac{e^{D_{C1}}}{1-e^{N\alpha}}$$

if maximum peaks are used; and, $$\lambda = \frac{e^{D_{C1}}}{e^{N\alpha}-1}$$

if minimum peaks are used.

It should be noted that the above equations may be expanded for cases where the number of valid pairs is greater than the two pairs described above.

With the DC fault current component, the DC component may be removed from the original samples to obtain a sinusoidal part of the original sampled secondary current signal using Equation 14:

$$S_{Ac}[n]=s[n]-s_{Dc}[n] \quad \text{Eq. 14}$$

where $S_{AC}[n]$ represents the original samples with the DC component removed.

Upon obtaining samples with the DC component removed, the fault current magnitude may be calculated. In one embodiment, the sinusoidal waveform ($A_c$) may be calculated in Equations 15 and 16, using the fault current magnitude matrix $M_2$ from the above Equations, depending on the number of valid pairs:

$$S_{M2} = \begin{bmatrix} S_{Ac}([n_1]) \\ S_{Ac}([n_2]) \end{bmatrix} \quad \text{Eq. 15}$$

$$A_c = \begin{bmatrix} A_{c1} \\ A_{c2} \end{bmatrix} = (M_2^T M_2)^{-1} M_2^T S_{M2} \quad \text{Eq. 16}$$

The fault magnitude $I_{Fault}$ in Root-Means Squared (RMS) may be calculated using Equation 17:

$$I_{Fault} = \frac{\sqrt{A_{c1}^2 + A_{c2}^2}}{\sqrt{2}} \quad \text{Eq. 17}$$

To further ease computation of the fault magnitude, the LMD may include a set of predetermined fault current magnitude matrices $M_2$ for various combinations of system frequency and sampling rate.

As generally described above, a fault current magnitude is determined during CT saturation by: sampling the current waveform once an overcurrent threshold is crossed; determining an unsaturated region; and, calculating a fault current magnitude. The unsaturated region is determined after removing fictitious maximum and minimum peaks. It should be noted that the above embodiments do not disclose the exclusive methods of calculating the saturated region or the fault magnitude using the unsaturated region.

Figure 7:
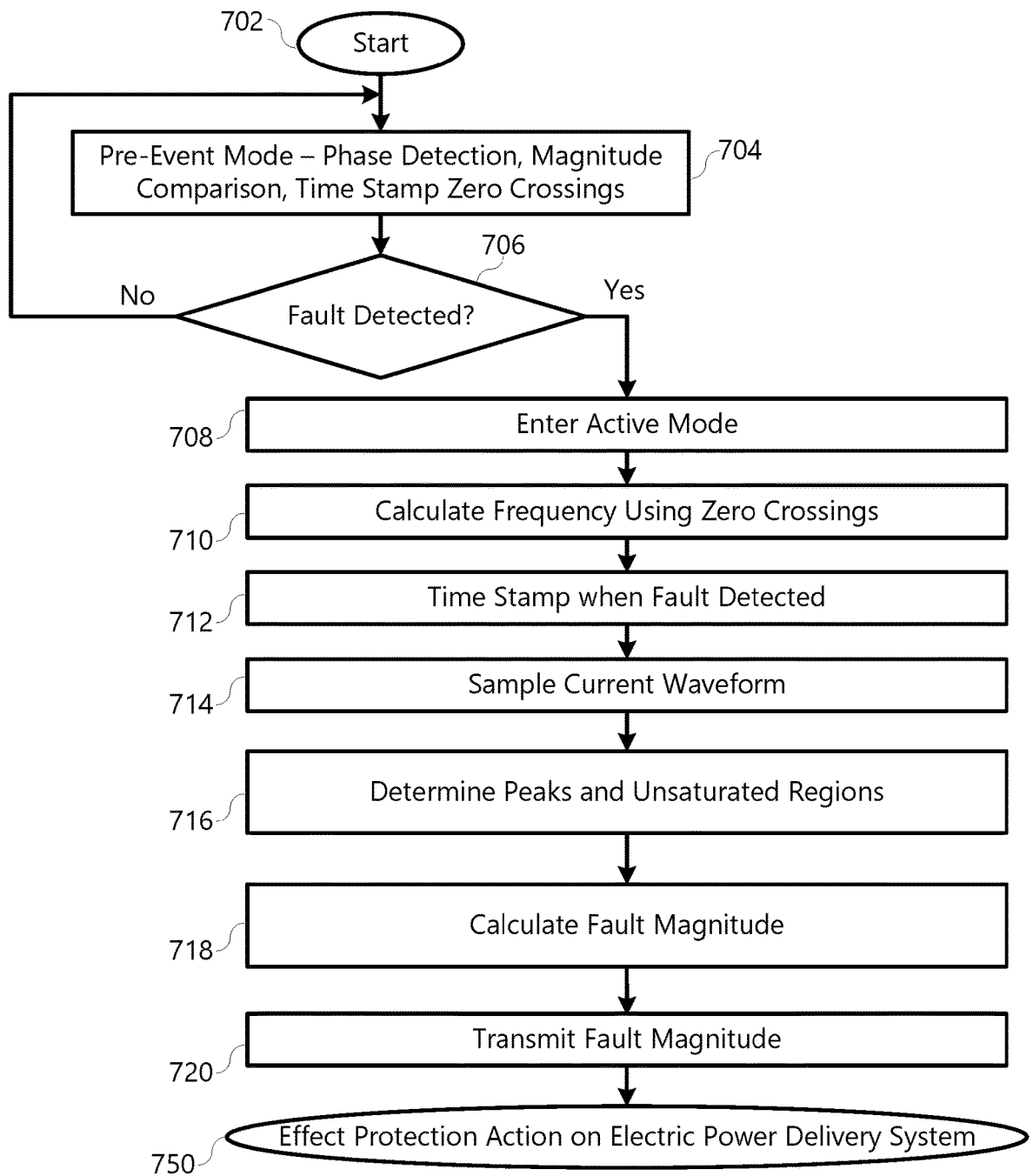
FIG. 7 illustrates a flow chart representing a method of protecting an electric power delivery system using fault magnitude values calculated by a line-mounted device under CT saturation.
Figure 8:
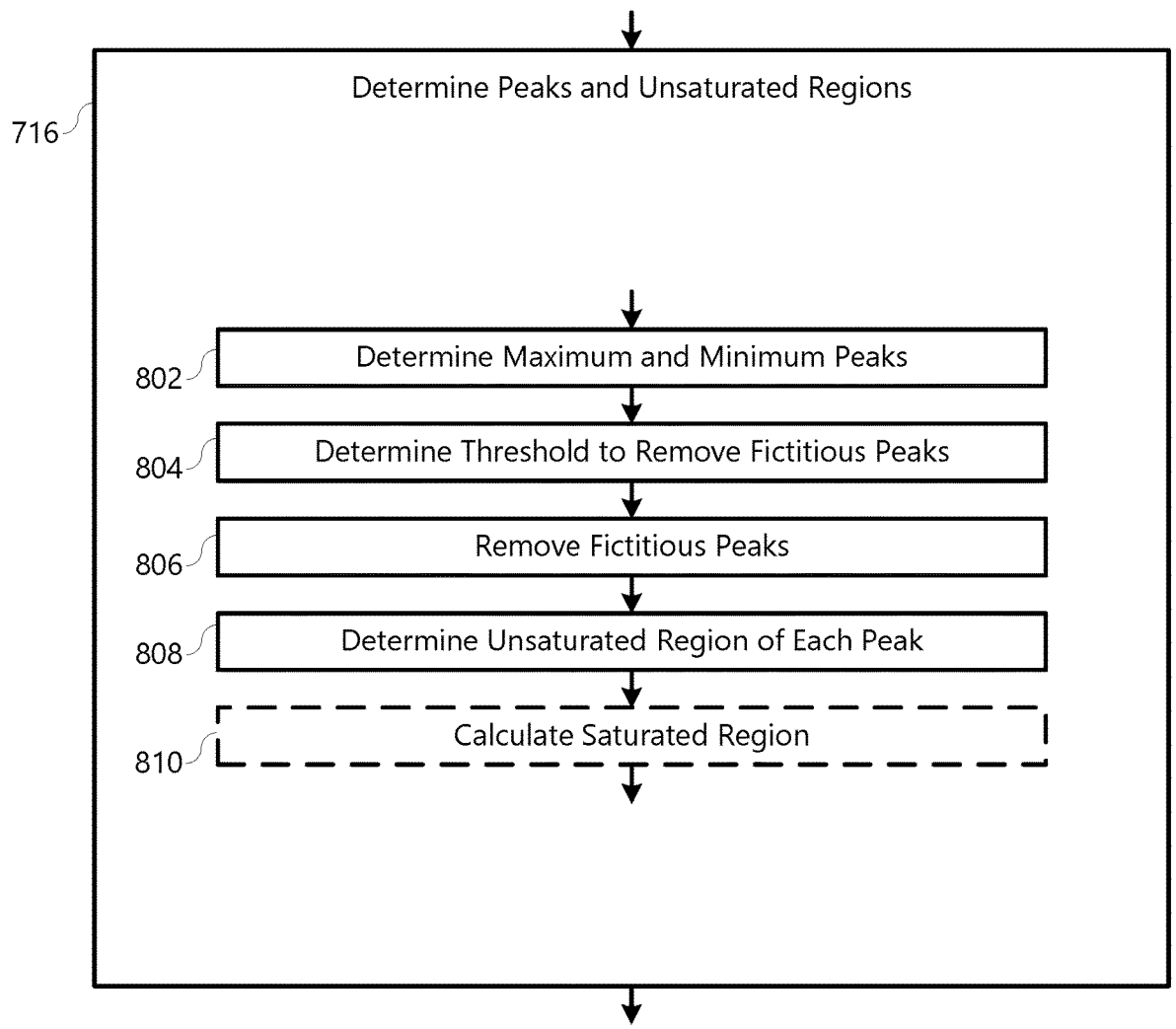
FIG. 8 illustrates a portion of a flow chart for determining peaks, unsaturated regions, and saturated regions in accordance with several embodiments herein.
Figure 9:
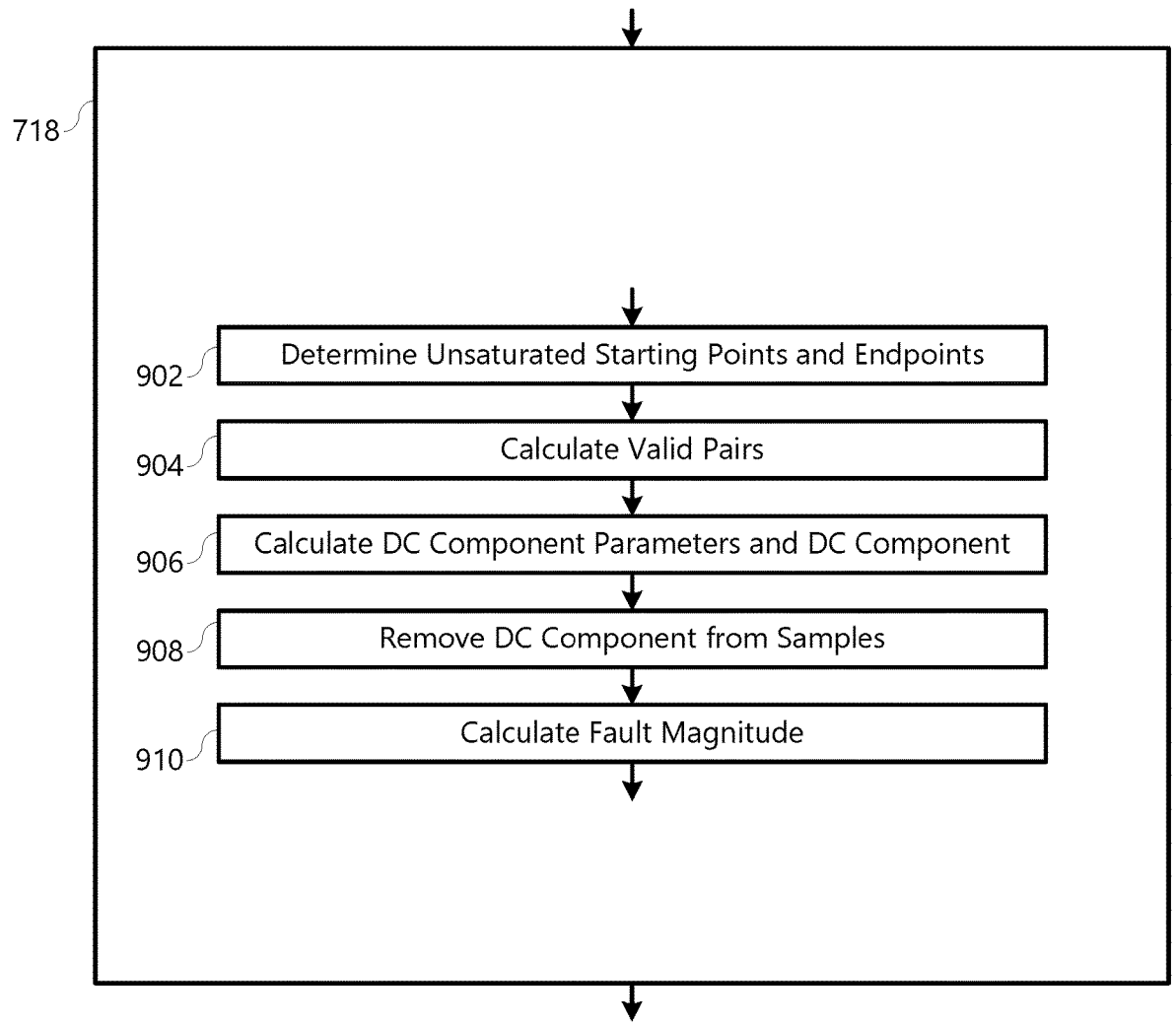
FIG. 9 illustrates a portion of a flow chart for calculating a fault magnitude in accordance with several embodiments herein.

FIGS. 7-9 illustrate a flow chart of a method for improving the functioning of a line-mounted device by calculating fault magnitude even when the CT is saturated. The method starts 702 in pre-event or low-power mode, during which the line-mounted device performs phase detection, compares a magnitude against a threshold, and time-stamps zero crossings 704. The comparison of the current magnitude against the threshold may be used to determine if a fault has occurred and resulted in an overcurrent condition on the electric power delivery system. If a fault is not detected 706 (the current magnitude does not exceed the predetermined threshold), then the method continues in pre-event mode 704.

If, however, a fault is detected (the current magnitude does exceed the predetermined threshold) 706, then the method continues to cause the line-mounted device to enter active mode 708. In active mode, the line-mounted device calculates frequency using zero crossings obtained during the pre-event mode 710. The line-mounted device also applies a time stamp to the current magnitude when the fault is detected 712. The line-mounted device also samples the current waveform 714 provided by the CT. It should be noted that steps 708, 710, 712, and 714 may all be initiated upon detection of the fault 706 (upon the current magnitude exceeding the predetermined threshold). Although not separately illustrated, in various embodiments, power system frequency may be calculated during pre-event mode.

With the calculated frequency and the sampled current waveform, the line-mounted device may determine peaks, and unsaturated regions 716. The peaks and unsaturated regions may be determined in accordance with the several embodiments described above, and as illustrated in FIG. 8.

The method may then calculate a fault magnitude 718. The fault magnitude may be determined using the methods described herein. Steps of determining fault magnitude in accordance with certain embodiments are also illustrated in FIG. 9. The line-mounted device may transmit the fault magnitude 720 to an IED or supervisory system. The IED or supervisory system may then effect a control or monitoring operation on the electric power delivery system using the calculated and received fault magnitude from the line-powered device 750.

Returning to the step of determining peaks and unsaturated regions 716, FIG. 8 illustrates steps useful for determining the peaks and unsaturated regions in accordance with several embodiments herein. With the current waveform sampled 714, the method may determine the maximum and minimum peaks 802. This determination may be made using sequential differences in consecutive samples, as described above. Other methods for determining maximum and minimum peaks may be used. Thresholds to remove fictitious peaks may be determined 804 as described above. Fictitious peaks may then be removed 806 leaving only the valid peaks. The unsaturated region of each peak may be determined 808 as described above. Optionally, the saturated region may be calculated 810 depending on whether it is needed for other operations of the LMD, including, for example, a calculation of a fault current magnitude.

With the peaks and unsaturated regions determined, the method may calculate a fault magnitude 718. The fault magnitude may be determined using any of a variety of methods. One method is as described above using sample pairs. The method may begin by determining unsaturated starting points and endpoints 902. From the samples within the unsaturated region, the method may calculate valid pairs 904 as described above. Using the valid pairs, DC component parameters and a DC component may be calculated 906. The DC component may then be removed 908, and the fault magnitude calculated 910. The method may return to transmit the fault magnitude 720.

Accordingly, presented herein is an improvement to the functioning of a line-mounted device in that the line-mounted device is capable of determining a fault magnitude even under CT saturation. The fault magnitude is calculated using computationally-efficient methods as described herein.

It should be noted that although the line-mounted devices described herein may be illustrated as applied to a distribution portion of an electric power delivery system, the line-mounted devices may be applied to any portion of an electric power delivery system including transmission, distribution, generation, and consumption; as well as at different voltage and current levels. Furthermore, the line-mounted devices herein may be applied to overhead portions of a power system, underground portions of a power system, or enclosed portions of a power system.

Furthermore, it should be noted that the improvements herein are applicable to any system configured to determine a fault current magnitude under saturated CT conditions. Accordingly, any device, such as an IED, that obtains secondary current signals from a saturated CT may use the improvements herein to determine a fault current magnitude.

The improvements herein may be used to recreate an alternating current (AC) signal from a secondary current signal of a saturated CT. Any device that receives secondary current signals from a saturated CT may use the improvements herein to remove DC components from the sampled current signal and produce samples representative of a secondary current signal without distortions introduced by CT saturation.

While specific embodiments and applications of the disclosure have been illustrated and described, it is to be understood that the disclosure is not limited to the precise configurations and components disclosed herein. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A line-mounted device for an electric power delivery system, configured to determine a fault magnitude under conditions of a saturated current transformer (CT), comprising:
   a current transformer in electrical communication with a conductor of the electric power delivery system, comprising a core and a winding including secondary leads;
   sensor circuitry in electrical communication with the secondary leads, configured to:
      calculate a frequency of a current signal on the electric power delivery system using a secondary signal from the secondary leads;
      compare a current magnitude of the secondary signal against a predetermined fault current threshold;
      when the current magnitude exceeds the predetermined fault current threshold, signal a controller of a fault condition;
   the controller in communication with the sensor circuitry, comprising:
      a processor;
      a non-transitory computer-readable storage in communication with the processor, comprising instructions that when operated cause the processor to:
         record samples of the secondary signal from the sensor circuitry to form a sampled secondary signal;
         determine a plurality of peaks of the secondary signal;
         remove fictitious peaks from the plurality of peaks to form a plurality of valid peaks;
         calculate an unsaturated region for each valid peak of the plurality of valid peaks to form a plurality of unsaturated regions;

calculate a fault magnitude using the plurality of unsaturated regions; and,
transmit the calculated fault magnitude to a consuming device for effecting a protective action on the electric power delivery system.

2. The line-mounted device of claim 1, further comprising communication circuitry in communication with the processor for transmitting the calculated fault magnitude to the consuming device.

3. The line-mounted device of claim 1, wherein the instructions further cause the processor to determine a threshold for removal of fictitious peaks, and removal of fictitious peaks comprises comparison of each peak of the plurality of peaks with the threshold.

4. The line-mounted device of claim 1, wherein the removal of fictitious peaks comprises comparison of each peak with a sample from the sampled secondary signal that is a predetermined number of samples away from the peak under comparison.

5. The line-mounted device of claim 4, wherein the predetermined number of samples is less than N/2 samples away from the peak under comparison, where N is a number of samples per cycle.

6. The line-mounted device of claim 1, wherein the unsaturated region for each valid peak of the plurality of valid peaks comprises an interval of samples between a first fraction of a value of the valid peak and a second fraction of the value of the valid peak.

7. The line-mounted device of claim 6, wherein the first fraction comprises around 30% of the value of the valid peak and the second fraction comprises around 90% of the value of the valid peak.

8. The line-mounted device of claim 1, wherein the non-transitory computer-readable storage comprises instructions that cause the processor to calculate the fault magnitude by:
determining valid pairs of samples from the sampled secondary signal within the unsaturated region for each valid peak;
calculating a DC component of the secondary signal from the valid pairs of samples;
removing the DC component from the secondary signal; and
calculating a fault magnitude from the secondary signal with the DC component removed.

9. A system for protecting an electric power delivery system, comprising:
a line-mounted device comprising a current transformer (CT) in electrical communication with a conductor of the electric power delivery system, and comprising a controller configured to:
during a pre-event mode, record times of zero crossings of a secondary current signal from the CT;
upon detection of a fault condition:
record a time of the detection of the fault condition;
calculate a frequency of a current on the electric power delivery system using the times of zero crossings of the current signal;
record samples of the secondary current signal from the CT to form a sampled secondary signal;
determine a plurality of peaks of the secondary signal;
remove fictitious peaks from the plurality of peaks to form a plurality of valid peaks;
calculate an unsaturated region for each valid peak of the plurality of valid peaks to form a plurality of unsaturated regions;
calculate a fault magnitude using the plurality of unsaturated regions; and,
transmit the calculated fault magnitude to a consuming intelligent electronic device (IED) for effecting a protective action on the electric power delivery system; and,
the IED in communication with a portion of the electric power delivery system configured to receive the calculated fault magnitude; determine the protective action based on information from the electric power delivery system; and, effect the protective action on the electric power delivery system by signaling a circuit breaker to open in response to the determined protective action.

10. The system of claim 9, wherein the line-mounted device is further configured to:
determine a threshold for removal of fictitious peaks; and,
compare each peak of the plurality of peaks with the threshold.

11. The system of claim 9, wherein the line-mounted device is further configured to:
compare of the peaks with a sample from the sampled secondary signal that is a predetermined number of samples away from the peak under comparison, for the removal of fictitious peaks.

12. The system of claim 11, wherein the sample from the sampled secondary signal is less than N/2 samples away from the peak under comparison, where N is the number of samples per cycle.

13. The system of claim 9, wherein the line-mounted device is configured to calculate the unsaturated region for each valid peak by determining an interval of samples between a first fraction of the peak and a second fraction of the peak.

14. The system of claim 9, wherein the line-mounted device is configured to calculate the fault magnitude by:
determining valid pairs of samples from the sampled secondary signal within the unsaturated region for each valid peak;
calculating a DC component of the secondary signal from the valid pairs of samples;
removing the DC component from the secondary signal; and
calculating a fault magnitude from the secondary signal with the DC component removed.

15. A method of improving functioning of a line-mounted device in determining fault magnitude in presence of current transformer (CT) saturation, comprising the steps of:
before detection of a fault, the line-mounted device receiving a secondary current signal using the CT in electrical communication with an electric power delivery system, determining zero crossings of the secondary current signal, time stamping and recording the zero crossings, and comparing a magnitude of the secondary current signal with a predetermined fault current threshold;
calculate a power system frequency using the zero crossings;
upon the magnitude of the secondary current signal exceeding the predetermined fault current threshold, the line-mounted device:
sampling the secondary current signal to form a sampled secondary current signal;
determining a plurality of peaks of the secondary signal;
removing fictitious peaks from the plurality of peaks to form a plurality of valid peaks;

calculating an unsaturated region for each valid peak of the plurality of valid peaks to form a plurality of unsaturated regions; and calculating a fault magnitude using the plurality of unsaturated regions; and, effecting a protection action on the electric power delivery system using the calculated fault magnitude.

16. The method of claim 15, further comprising determining a threshold for removal of fictitious peaks, and the step of removing fictitious peaks comprises comparison of each peak of the plurality of peaks with the threshold.

17. The method of claim 15, wherein the step of removing fictitious peaks comprises comparing each peak of the plurality of peaks with a sample from the sampled secondary signal that is a predetermined number of samples away from the peak under comparison.

18. The method of claim 17, wherein the predetermined number of samples is less than N/2 samples away from the peak under comparison, where N is a number of samples per cycle.

19. The method of claim 15, wherein the step of calculating the unsaturated region for each valid peak of the plurality of peaks comprises determining an interval of samples between a first fraction of the peak and a second fraction of the peak.

20. The method of claim 15, wherein the fault magnitude is calculated by:

determining valid pairs of samples from the sampled secondary signal within the unsaturated region for each valid peak;

calculating a DC component of the secondary signal from the valid pairs of samples;

removing the DC component from the secondary signal; and calculating a fault magnitude from the secondary signal with the DC component removed.

\* \* \* \* \*